United States Patent [19]
Hirata et al.

[11] Patent Number: 5,138,199
[45] Date of Patent: Aug. 11, 1992

[54] LEVEL CONVERSION CIRCUIT FOR CONVERTING ECL-LEVEL SIGNAL INTO TTL-LEVEL SIGNAL

[75] Inventors: Michiyuki Hirata; Chikai Ono; Osamu Nomura, all of Kasugai; Toru Fukui, Seto; Susumu Terawaki, Kasugai, all of Japan

[73] Assignee: Fujitsu Limited, Kawasaki, Japan

[21] Appl. No.: 524,467

[22] Filed: May 17, 1990

[30] Foreign Application Priority Data

May 17, 1989 [JP] Japan .................................. 1-123414

[51] Int. Cl.⁵ .................... H03K 19/02; H03K 19/094
[52] U.S. Cl. ...................................... 307/475; 307/446; 307/451; 307/570
[58] Field of Search ................ 307/443, 446, 448, 451, 307/475, 570

[56] References Cited

U.S. PATENT DOCUMENTS

| | | | |
|---|---|---|---|
| 4,032,795 | 6/1977 | Hale | 307/475 |
| 4,694,202 | 9/1987 | Iwamura et al. | 307/475 |
| 4,769,561 | 9/1988 | Iwamura et al. | 307/475 |

FOREIGN PATENT DOCUMENTS

| | | |
|---|---|---|
| 0239059 | 9/1987 | European Pat. Off. |
| 0279332 | 8/1988 | European Pat. Off. |
| 0304035 | 2/1989 | European Pat. Off. |
| 0317430 | 5/1989 | European Pat. Off. |

Primary Examiner—Stanley D. Miller
Assistant Examiner—Margaret Rose Wambach
Attorney, Agent, or Firm—Staas & Halsey

[57] ABSTRACT

A level conversion circuit includes a level converter and a buffer gate circuit. A level converter includes two pairs of P-channel MOS transistors. A first input signal is supplied to one of the pair of P-channel MOS transistors and a second input signal is supplied to one of the other pair of P-channel MOS transistors. Each of the first and second input signals are complementary ECL-level signals. The buffer gate circuit includes two BiCMOS circuits. A first output signal from one of the pairs of P-channel MOS transistors is supplied to a gate of an N-channel MOS transistor provided in one of the BiCMOS circuits. A second output signal from the other pair of P-channel MOS transistors is supplied to a gate of an N-channel MOS transistor provided in the other BiCMOS circuit. The first input signal is supplied directly to a gate of a P-channel MOS transistor provided in one the BiCMOS circuits. The second input signal is supplied directly to a gate of a P-channel MOS transistor provided in the other BiCMOS circuit. A first TTL-level output signal is output from one of the circuits, and a second TTL-level output signal is output from the other BiCMOS circuit.

19 Claims, 9 Drawing Sheets

LEVEL CONVERSION CIRCUIT FOR CONVERTING ECL-LEVEL SIGNAL INTO TTL-LEVEL SIGNAL

BACKGROUND OF THE INVENTION

The present invention generally relates to a level conversion circuit for converting an ECL (Emitter Coupled Logic) level signal into a TTL (Transistor-Transistor Logic) level signal. The present invention is suitable for a level conversion circuit provided in a BiCMOS (Bipolar Complementary Metal Oxide Semiconductor) memory such as BiCMOS-ECL SRAM (Static Random Access Memory).

There is known a BiCMOS SRAM having a level conversion circuit and a TTL-level internal logic circuit. An ECL-level input signal is input to the level conversion circuit, which converts the ECL-level input signal into a TTL-level signal. The converted TTL-level signal is input to the TTL-level internal logic circuit. In order to increase the operating speed of such a memory, it is necessary to increase the operating speed of the level conversion circuit.

Referring to FIG. 1, there is illustrated an ECL gate circuit 1 and a level conversion circuit 2. The ECL gate circuit 1 is made up of five bipolar transistors Tr1-Tr5. An input signal is subjected to a level shift operation by the transistor Tr1. The transistors Tr2 and Tr3 form a differential switch circuit. A reference volta $V_R$ is always applied to the base of the transistor Tr3. When a low-level input signal is applied to an input terminal A connected to the base of the transistor Tr1, the transistor Tr3 is turned ON. On the other hand, when a high-level input signal is applied to the input terminal A, the transistor Tr2 is turned ON and the transistor Tr3 is turned OFF.

Thus, when the high-level signal is applied to the input terminal A, the transistor Tr4 outputs a low-level signal and the transistor Tr5 outputs a high-level signal. When the low-level signal is applied to the input terminal A, the output signals of the transistors Tr4 and Tr5 are inverted.

The output signals from the ECL gate circuit 1 are input to the level conversion circuit 2, which are composed of P-channel MOS transistors Tr6, Tr8, Tr10 and Tr12 and N-channel MOS transistors Tr7, Tr9, Tr11 and Tr13. When the transistors Tr4 and Tr5 of the ECL gate circuit 1 output the low-level signal and the high-level signal, respectively, the transistors Tr8 and Tr10 are turned ON, and the transistors Tr6 and Tr12 are turned OFF. When the transistor Tr6 is turned OFF, the transistors Tr7 and Tr9 are also turned OFF. Thus, a high-level output signal from the level conversion circuit 2 is applied to a buffer gate 3a having a BiCMOS inverter. Thus, the buffer gate 3a generates an output signal Q at a low-level.

When the transistor Tr10 is turned ON, the transistors Tr11 and Tr13 are also turned ON. Thus, a low-level output signal from the level conversion circuit 2 is applied to a buffer gate 3b having a BiCMOS inverter. Thus, the buffer gate 3b outputs an output signal $\overline{Q}$ having a high level. Thus, the output signal Q from the buffer gate 3b has the logic value opposite to that of the input signal A, and the output signal $\overline{Q}$ has the logic value identical to that of the input signal A.

The output signals from the ECL gate circuit 1 are all input to the P-channel MOS transistors Tr6, Tr8, Tr10 and Tr12. This is due to the fact that the output signals from the ECL gate circuit 1 are not sufficient to drive N-channel MOS transistors because of the difference in characteristics of the P-channel MOS transistors and the N-channel MOS transistors in the level conversion circuit 2. The output signals from the ECL gate circuit 1 are input directly to the P-channel MOS transistors Tr8 and Tr12 which drive the buffer gates 3a and 3b. On the other hand, the N-channel MOS transistors Tr9 and Tr13 which drive the buffer gates 3a and 3b are driven through the P-channel MOS transistors Tr6, Tr7, Tr10 and Tr11.

The level conversion circuit 2 does not have a load driveability sufficient to drive a large number of internal circuits. For this reason, the buffer gates 3a and 3b are interposed between the level conversion circuit 2 and internal circuits (not shown) processing TTL-level signals so that a load driveability sufficient to the internal circuits is attained.

FIG. 2 shows a detained structure of the buffer gates 3a and 3b. The buffer gate 3a is composed of MOS transistors Tr14 and Tr15 which form an input stage thereof, and bipolar transistors Tr18 and Tr19 which form an output stage thereof. Similarly, the buffer gate 3b is composed of MOS transistors Tr16 and Tr17 and bipolar transistors Tr20 and Tr21.

The output signals from the ECL gate circuit 1 are supplied to the internal circuits through the level conversion circuit 2 and the buffer gates 3a and 3b. Thus, it takes a long time to execute the level conversion from the ECL level into the TTL level so that the operation speed of the level conversion is not high. For example, the low-level signal is applied to the transistor Tr6, and the transistors Tr7 and Tr9 are turned ON and thereafter the low-level signal is input to the buffer gate 3a. Thus it takes a time amounting to three stages of transistors to obtain the high-level output signal from the buffer gate 3a. Further, it takes the operating time of the buffer gate 3a to supply the internal circuits with the output signal of the buffer gate 3a.

It is considered to increase the load driveability of the level conversion circuit 2 so that the buffer gates 3a and 3b are omitted. In order to realize such an arrangement, it is necessary to increase the dimension of each transistor in the level conversion circuit 2. This leads to a decrease in the integration level.

FIG. 3 shows waveforms obtained at nodes (a) through (i) shown in FIG. 1 when the ECL-level input signal applied to the input terminal A changes from the low level to the high level. The low level of the input signal is approximately −1.7 volts, and the high level thereof is approximately −0.9 volts. The TTL-level output signal Q from the buffer gate 3a shown in FIG. 3-(h) is changed from the high level to the low level. The high level of the output signal from the buffer gate 3a is approximately 0.4 volts and the low level thereof is approximately −0.4 volts. As shown in FIG. 3-(i), the TTL-level output signal $\overline{Q}$ is changed from the low level to the high level. The delay time it takes to convert the ECL level into the TTL-level is approximately 1.8 ns.

SUMMARY OF THE INVENTION

It is a general object of the present invention to provide an improved level conversion circuit in which the aforementioned disadvantages are eliminated.

A more specific object of the present invention is to provide a level conversion circuit having an increased operating speed without decreasing the integration level.

The above-mentioned objects of the present invention are achieved by a level conversion circuit comprising a level converter receiving first and second input signals which are complementary ECL-level signals, the level converter including first and second P-channel MOS transistors which are connected in series between a first power source and a second power source, and third and fourth P-channel MOS transistors which are connected in series between the first power source and the second power source, the first input signal being applied to gates of the first and fourth P-channel MOS transistors, the second input signal being applied to gates of the second and third P-channel MOS transistors, a first output signal being drawn from a first connection node where the first and second P-channel MOS transistors are connected in series, a second output signal being drawn from a second connection node where the third and fourth P-channel MOS transistors are connected in series. The level conversion circuit also comprises a buffer gate circuit having a first buffer gate and a second buffer gate. The first buffer gate includes a fifth P-channel MOS transistor and a first impedance circuit connected in series between said first power source and a potential less than a potential of said first power source and includes a first N-channel MOS transistor and a second impedance circuit connected in series between said first power source and said potential less than the potential of said first power source. The second input signal is applied directly to a gate of said fifth P-channel MOS transistor. The first output signal is applied to a gate of said first N-channel MOS transistor. The second buffer gate includes a sixth P-channel MOS transistor and a third impedance circuit connected in series between said first power source and the potential less than the potential of said first power source, and includes a second N-channel MOS transistor and a fourth impedance circuit connected in series between said first power source and the potential less than the potential of said first power source. The first input signal is applied directly to a gate of said sixth P-channel MOS transistor. The second output signal is applied to a gate of said second N-channel MOS transistor. The buffer gate circuit includes first driving means for receiving output signals from the fifth P-channel MOS transistor and the first N-channel MOS transistor and for generating a first TTL-level output signal, and second driving means for receiving output signals from the sixth P-channel MOS transistor and the second N-channel MOS transistor and for generating a second TTL-level output signal.

The aforementioned objects of the present invention are also achieved by a level conversion circuit comprising a level converter receiving first and second input signals which are complementary ECL-level signals, the level converter including first and second P-channel MOS transistors which are connected in series between a first power source and a second power source, and third and fourth P-channel MOS transistors which are connected in series between the first power source and the second power source, the first input signal being applied to gates of the first and fourth P-channel MOS transistors, the second input signal being applied to gates of the second and third P-channel MOS transistors, a first output signal being drawn from a first connection node where the first and second P-channel MOS transistors are connected in series, a second output signal being drawn from a second connection node where the third and fourth P-channel MOS transistors are connected in series. The level conversion circuit also comprises a buffer gate circuit having a first buffer gate and a second buffer gate. The first buffer gate includes the first P-channel MOS transistor and a first N-channel MOS transistor connected in series between the first and second power sources. The first buffer gate includes a second N-channel MOS transistor and a third N-channel MOS transistor connected in series between the first and second power sources. The second buffer gate includes the third P-channel MOS transistor and a fourth N-channel MOS transistor connected in series between the first and second power sources. The second buffer gate includes a fifth N-channel MOS transistor and a sixth N-channel MOS transistor connected in series between the first and second power sources. The first output signal from the first connection node is applied to gates of the third, fourth and fifth N-channel MOS transistors. The second output signal from the second connection node is applied to gates of the first, third and sixth N-channel MOS transistors. The buffer gate circuit includes first driving means for receiving two output signals respectively supplied from the first connection node and a connection node where the second and third N-channel MOS transistors are connected in series and for generating a first TTL-level output signal, and second driving means for receiving two output signals respectively supplied from the second connection node and a connection node where the fifth and sixth N-channel MOS transistors are connected in series and for generating a second TTL-level output signal.

The aformentioned objects of the present invention are also achieved by a level conversion circuit comprising a level converter receiving first and second input signals which are complementary ECL-level signals, said level converter including first and second P-channel MOS transistors which are connected in series between a first power source and a second power source, the first input signal being applied to a gate of the first P-channel MOS transistor, the second input signal being applied to a gate of the second P-channel MOS transistor, an output signal being drawn from a connection node where the first and second P-MOS transistors are connected in series; and a buffer gate circuit having a buffer gate. The buffer gate includes a third P-channel MOS transistor and a first impedance which are connected in series between the first power source and a predetermined potential less than a potential of the first power source. The first buffer gate includes an N-channel MOS transistor and a second impedance circuit which are connected in series between the first power source and a potential less than the potential of the first power source. The third P-channel MOS transistor has a gate to which the second input signal is directly applied, and the N-channel MOS transistor having a gate to which the output signal from the connection node is applied. The buffer gate circuit includes driving means for receiving output signals from the third P-channel MOS transistor and the N-channel MOS transistor and for generating a TTL-level output signal.

Other objects, features and advantages of the present invention will become apparent from the following detailed description when read in conjunction with the accompanying drawings.

DESCRIPTION OF THE PREFERRED EMBODIMENTS

Figure 1:
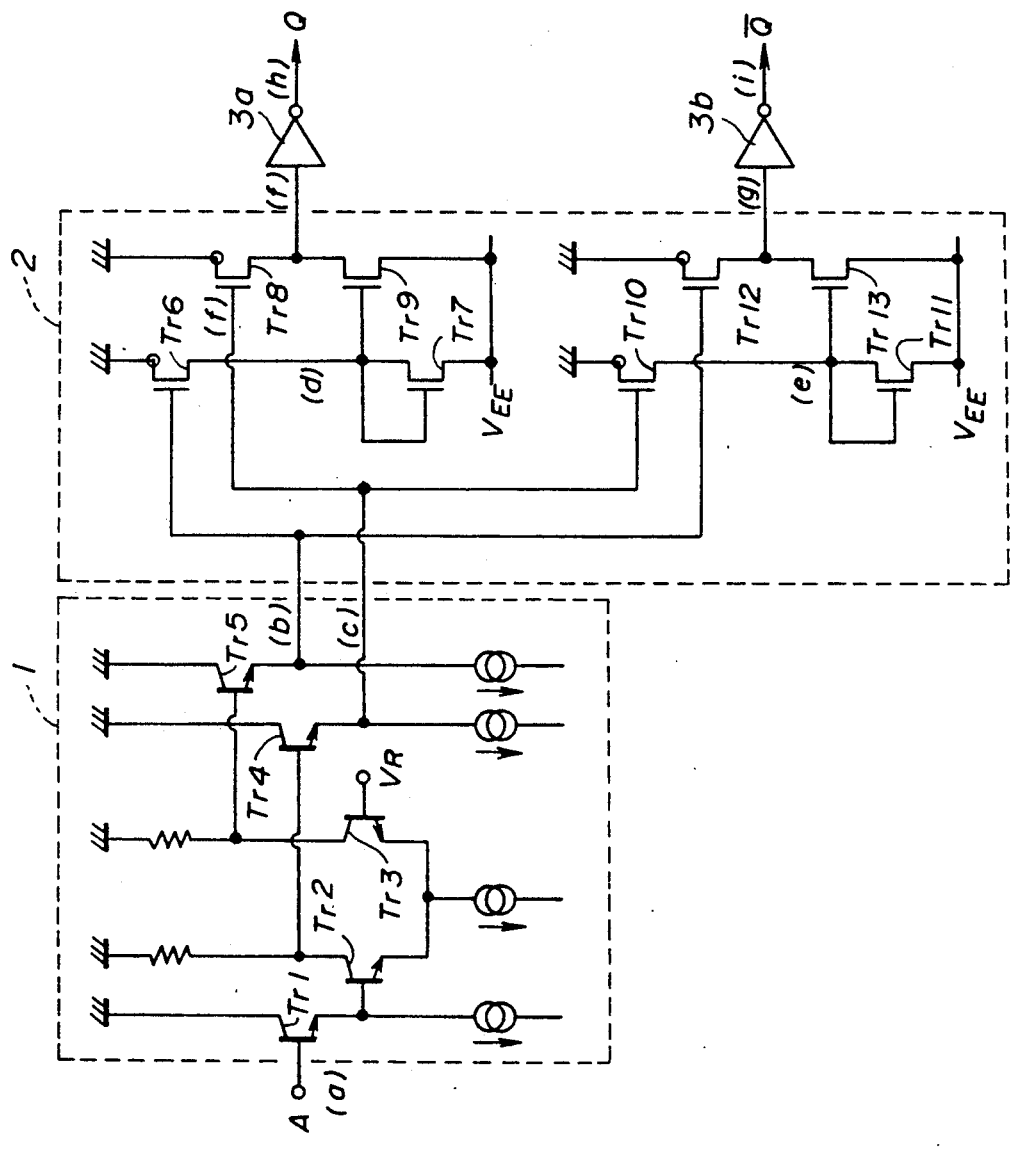
FIG. 1 is a circuit diagram of an input gate circuit of a SRAM having a conventional level conversion circuit which converts an ECL level into a TTL level.
Figure 2:
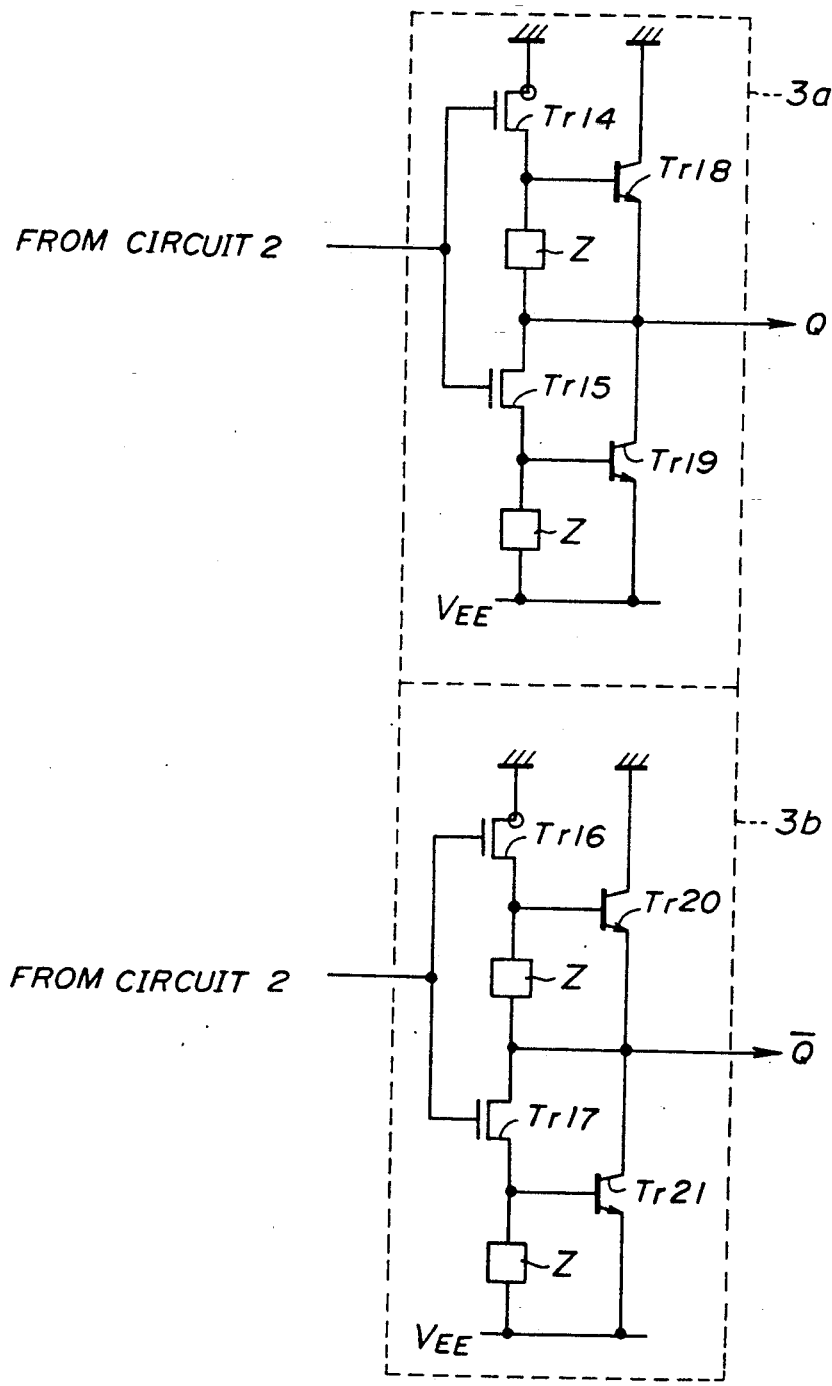
FIG. 2 is a circuit diagram of buffer gates used in the output gate circuit shown in FIG. 1.
Figure 3:
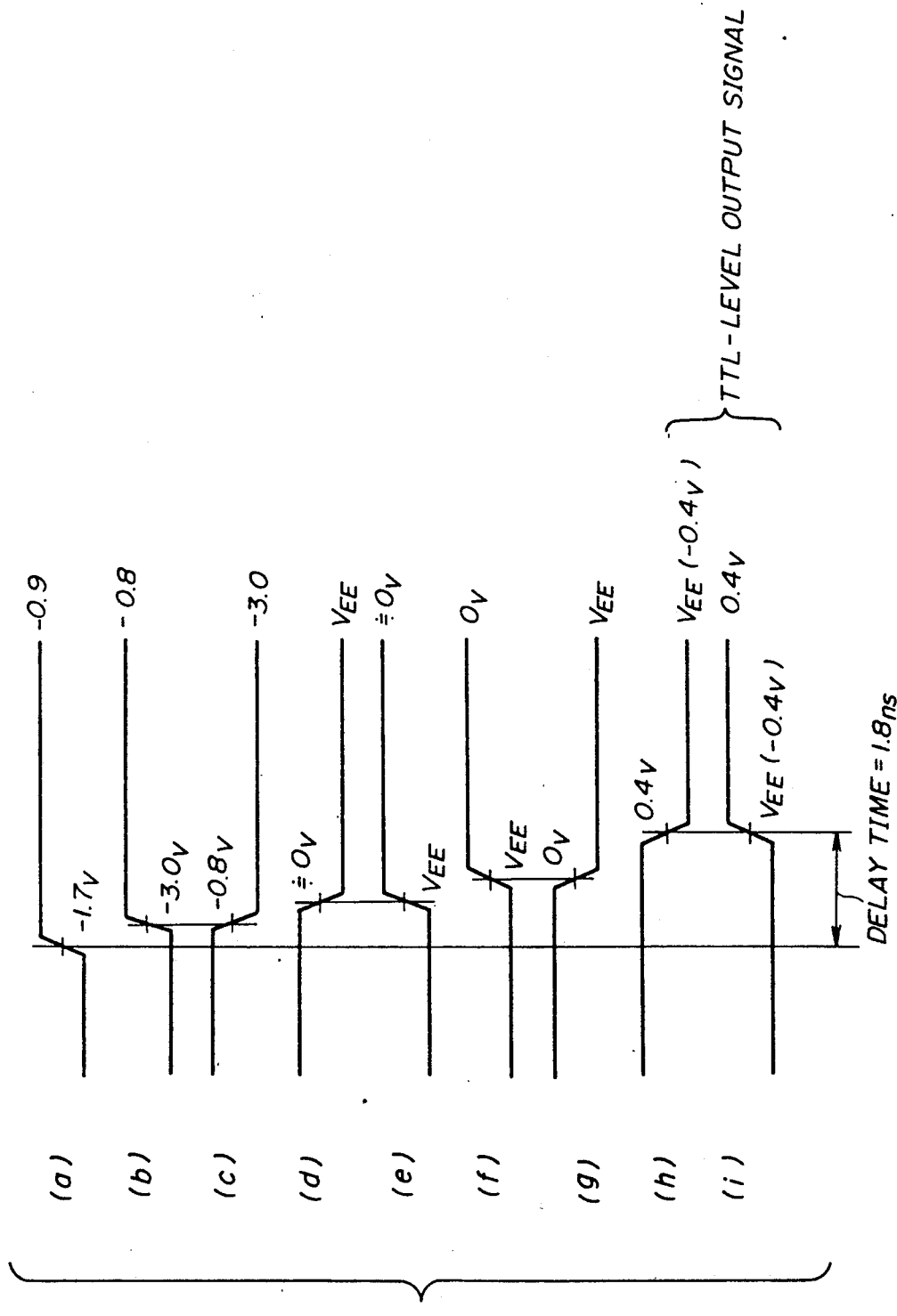
FIG. 3 is a waveform diagram of signals observed at nodes of the level conversion circuit shown in FIG. 1.
Figure 4:
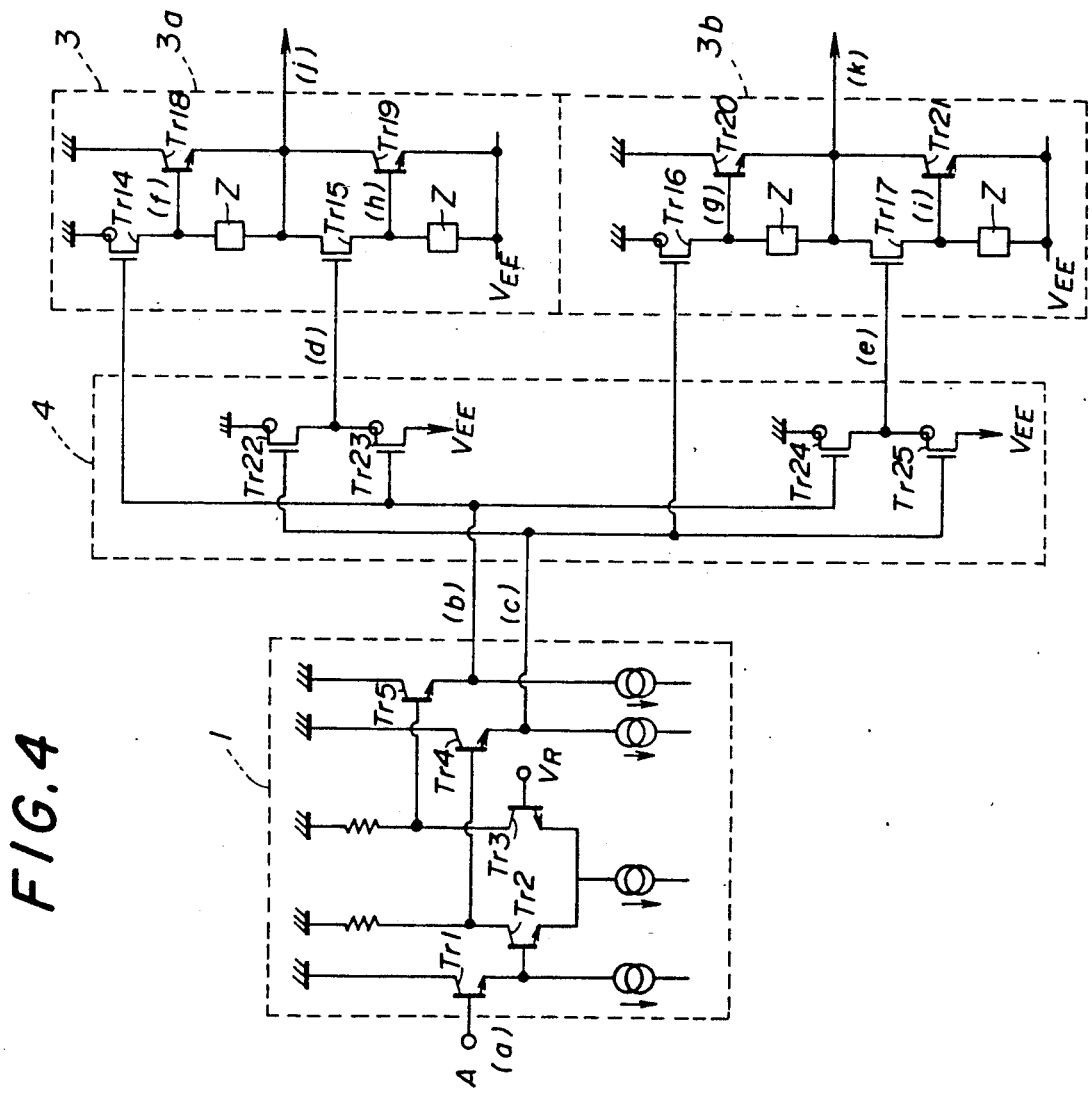
FIG. 4 is a circuit diagram illustrating the principle of the present invention.

A description will be given of the principle of the present invention with reference to FIG. 4. A level conversion circuit shown in FIG. 4 is composed of a level converter 4 and a buffer gate circuit 3. The buffer gate 3 is composed of the aforementioned buffer gates 3a and 3b. The level conversion circuit converts the complementary ECL-level output signals from the aforementioned ECL gate circuit 1 into TTL-level output signals. The level converter 4 includes four P-channel MOS transistors Tr22, Tr23, Tr24 and Tr25. The gate of the transistor Tr22 is supplied with the output signal from the transistor Tr25. The source of the transistor Tr22 is connected to the ground (which serves as a positive power source), and the drain thereof is connected to the source of the transistor Tr23. The gate of the transistor Tr23 is supplied with the output signal from the transistor Tr5, and the drain of the transistor T23 is connected to a negative power source $V_{EE}$. The gate of the transistor Tr24 is supplied with the output signal from the transistor Tr5. The source of the transistor Tr24 is connected to the ground and the drain thereof is connected to the source of the transistor Tr25. The gate of the transistor Tr25 is supplied with the output signal from the transistor Tr4, and the drain thereof is connected to the negative power source $V_{EE}$. As will be seen from the above, the transistors Tr22 and Tr23 are connected in series between the ground and the negative power source $V_{EE}$, and the transistors Tr24 and Tr25 are connected in series between the ground and the negative power source $V_{EE}$. The gates of the transistors Tr23 and Tr24 are connected to the gate of the transistor Tr14 of the buffer gate 3a. The gates of the transistors Tr22 and Tr25 are connected to the gate of the transistor Tr16 of the buffer gate 3b. The drain of the transistor Tr22 and the source of the transistor Tr23 are connected to the transistor Tr15. The drain of the transistor Tr24 and the source of the transistor Tr25 are connected to the gate of the transistor Tr17. Impedance circuits Z are connected as shown in FIG. 4.

The P-channel MOS transistors Tr14 and the Tr16 of the buffer gates 3a and 3b are driven directly by the output signals from the ECL gate circuit 1. The N-channel MOS transistor Tr15 is driven through a single-stage P-channel MOS transistor circuit composed of the P-channel MOS transistors Tr22 and Tr23. Similarly, the N-channel MOS transistor Tr17 is driven through a single-stage P-channel MOS transistor circuit composed of the P-channel MOS transistors Tr24 and Tr25. With this arrangement, it becomes possible to convert the ECL-level into the TTL-level at higher speeds.

Figure 5:
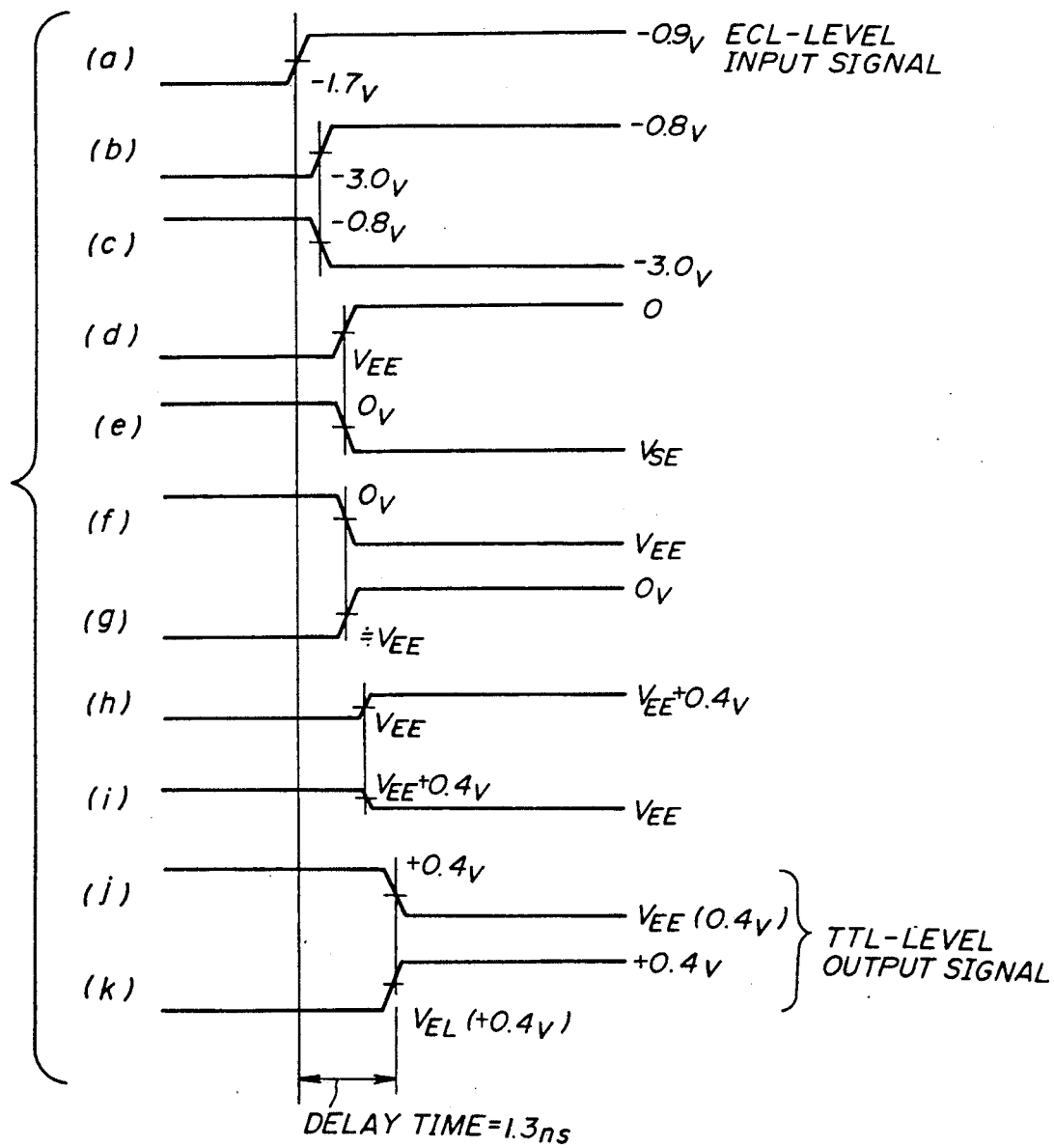
FIG. 5 is a waveform diagram of signals obtained at nodes of the level conversion circuit shown in FIG. 4.

FIG. 5 illustrates waveforms of signals which are obtained at nodes (a) through (k) shown in FIG. 4 when the input signal (FIG. 5-(a)) applied to the input terminal A changes from the low level to the high level. The delay time it takes to convert the ECL level into the TTL level is approximately 1.3 ns.

Figure 6:
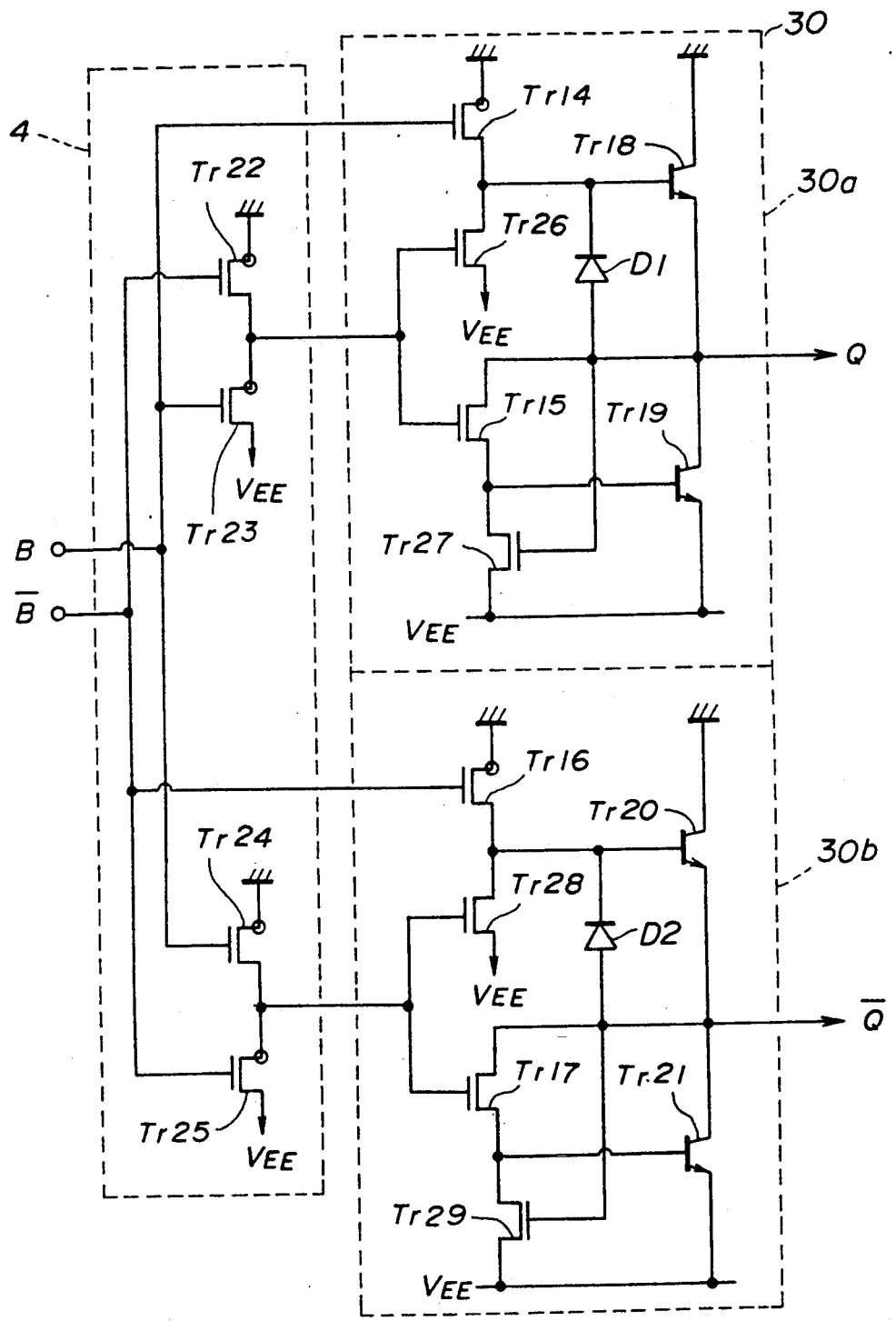
FIG. 6 is a circuit diagram of a level conversion circuit according to a first preferred embodiment of the present invention.

A description will now be give of a level conversion circuit according to a first preferred embodiment of the present invention with reference to FIG. 6. The level conversion circuit in FIG. 6 is composed of the level converter 4 and a buffer gate circuit 30 which is composed of buffer gates 30a and 30b. The ECL gate circuit 1 shown in FIG. 4 is omitted for the sake of simplicity. Input terminals B and $\overline{B}$ are supplied with the output signals of the transistors Tr15 and Tr14 of the ECL gate circuit 1 (FIG. 4), respectively. The input terminal B is connected to the gates of the transistors Tr23 and Tr24. The input terminal $\overline{B}$ is connected to the gates of the transistors Tr22 and Tr25.

The impedance circuits Z of the buffer gate circuit 3 shown in FIG. 4 are formed of N-channel MOS transistors Tr26, Tr27, Tr28 and Tr29 in the buffer gate circuit 30. The gates of the transistors Tr15 and Tr26 of the buffer gate 30a are connected to the connection node of the transistors Tr22 and the Tr23 of the level converter 4. The gate of the transistors Tr17 and Tr28 of the buffer gate 30b are connected to the connection node of the transistors Tr24 and Tr25 of the level converter 4. The drain of the transistor Tr15 forms the output terminal Q of the buffer gate 30a. Likewise, the drain of the transistor Tr17 forms the output terminal $\overline{Q}$ of the buffer gate 30b. The buffer gate 30a has an diode D1. The anode of the diode D1 is connected to the gate of the transistor Tr27 and the drain of the transistor Tr15, and the cathode thereof is connected to the connection node of the transistors Tr14 and Tr26 as well as the base of the transistor 18. The buffer gate 30b has a diode D2. The anode of the diode D2 is connected to the gate of the transistor Tr29 and the drain of the transistor Tr17, and the cathode thereof is connected to the connection node of the transistors Tr16 and Tr28 as well as the base of the transistor 20.

A description will now be given of the operation of the level conversion circuit shown in FIG. 6. When the high-level output signal and the low-level output signals from the ECL gate circuit 1 (FIG. 4) are input to the input terminals B and $\overline{B}$, respectively, the transistors Tr14, Tr23 and Tr24 are turned OFF, and the transistors Tr22, Tr16 and Tr25 are turned ON. Due to the change that the transistor Tr22 is turned ON, the transistors Tr26 and Tr15 are turned ON. In response to these changes in states of the transistors Tr26 and Tr15, the transistor Tr18 is turned OFF and the transistor Tr19 is turned ON. Thus, the low-level output signal is drawn from the output terminal Q. Due to the change that the transistors Tr16 and Tr25 are turned ON, the transistor Tr20 is turned ON and the transistor Tr21 is turned OFF. Thus, the high-level output signal is drawn from the output terminal $\overline{Q}$.

On the other hand, when the output signals from the ECL gate circuit 1 (FIG. 4) are inverted, the high-level signal is drawn from the output terminal Q and the low-level output signal is drawn from the output terminal $\overline{Q}$. During the above operation, the transistors Tr27 and Tr29 are turned ON when the transistors Tr19 and Tr21 changes from ON to OFF. Thus, the transistors Tr27 and Tr29 function to facilitate the turn-OFF operation of the transistors Tr19 and Tr21 and increase the level conversion operation from the L level to the high level at output terminals Q and $\overline{Q}$. The diodes D1 and D2 absorb reverse bias voltages which are generated between the base and emitter of the transistors Tr18 and Tr20 when the transistors Tr18 and Tr20 are turned OFF. That is, the diodes D1 and D2 function to protect the transistors Tr18 and Tr20.

The P-channel MOS transistors Tr14 and Tr16 of the input stages of the buffer gates 30a and 30b are driven by the output signals of the ECL gate circuit 1 (FIG. 4). On the other hand, the N-channel MOS transistors Tr26 and Tr15 of the input stage of the buffer gate 30a are driven through a single-stage P-channel MOS circuit composed of the P-channel MOS transistors Tr22 and Tr23 of the level converter 4. Likewise, the N-channel MOS transistors Tr28 and Tr17 are driven through a single-stage P-channel MOS circuit composed of the P-channel MOS transistors Tr24 and Tr25 of the level converter 4. Thus, it becomes possible to perform the level conversion at higher speeds and reduce the number of elements which form the entire level conversion circuit.

Figure 7:
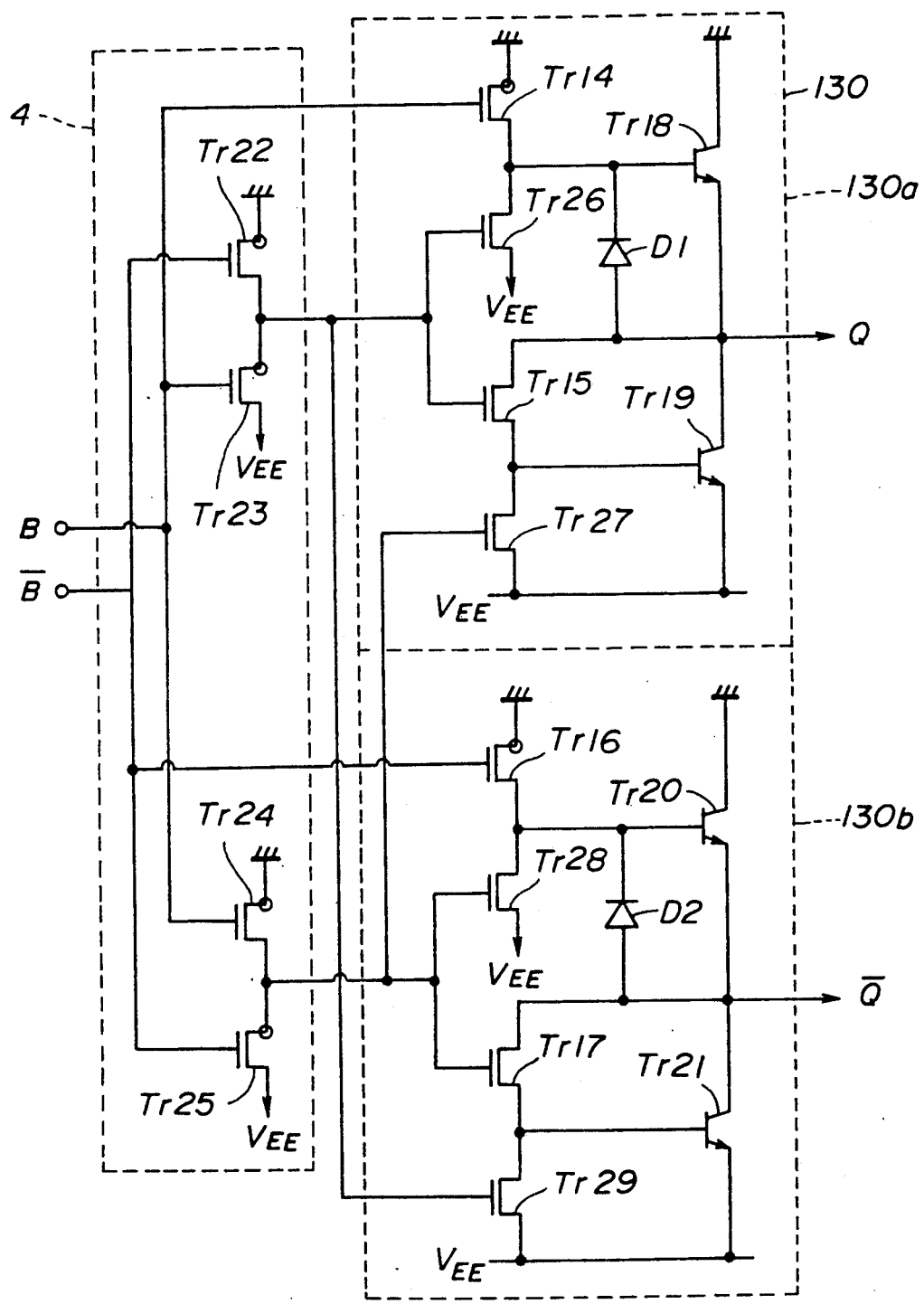
FIG. 7 is a circuit diagram of a level conversion circuit according to a second preferred embodiment of the present invention.

A description will now be given of a second preferred embodiment of the present invention with reference to FIG. 7. The configuration of the level conversion circuit shown in FIG. 7 is the same as that of the level conversion circuit shown in FIG. 6 except that the gates of the transistors Tr27 and Tr29 of the buffer gates 30a and 30b in FIG. 6 are connected to the input terminals of the buffer gates 30b and 30a, respectively. The gate of the transistor Tr27 of a buffer gate 130a of a buffer gate circuit 130 is connected to the gates of the transistors Tr17 and Tr28 of a buffer gate 130b of the buffer gate circuit 130. The gate of the transistor Tr29 of the buffer gate 130b is connected to the gates of the transistors Tr15 and Tr26. The anode of the diode D1 is not connected to the gate of the transistor Tr27. The anode of the diode D2 is not connected to the gate of the transistor Tr29. The transistor Tr27 shown in FIG. 7 is driven by the output signal from the transistors Tr24 and Tr25, and the transistor Tr29 is driven by the transistors Tr22 and Tr23. Thus, the transistors Tr27 and Tr29 in FIG. 7 rise more rapidly than those shown in FIG. 6. The operation of the level conversion circuit shown in FIG. 7 is the same as that of the level conversion circuit shown in FIG. 6 except that the transistors Tr27 and Tr29 are driven by the output signals from the level converter 4.

Figure 8:
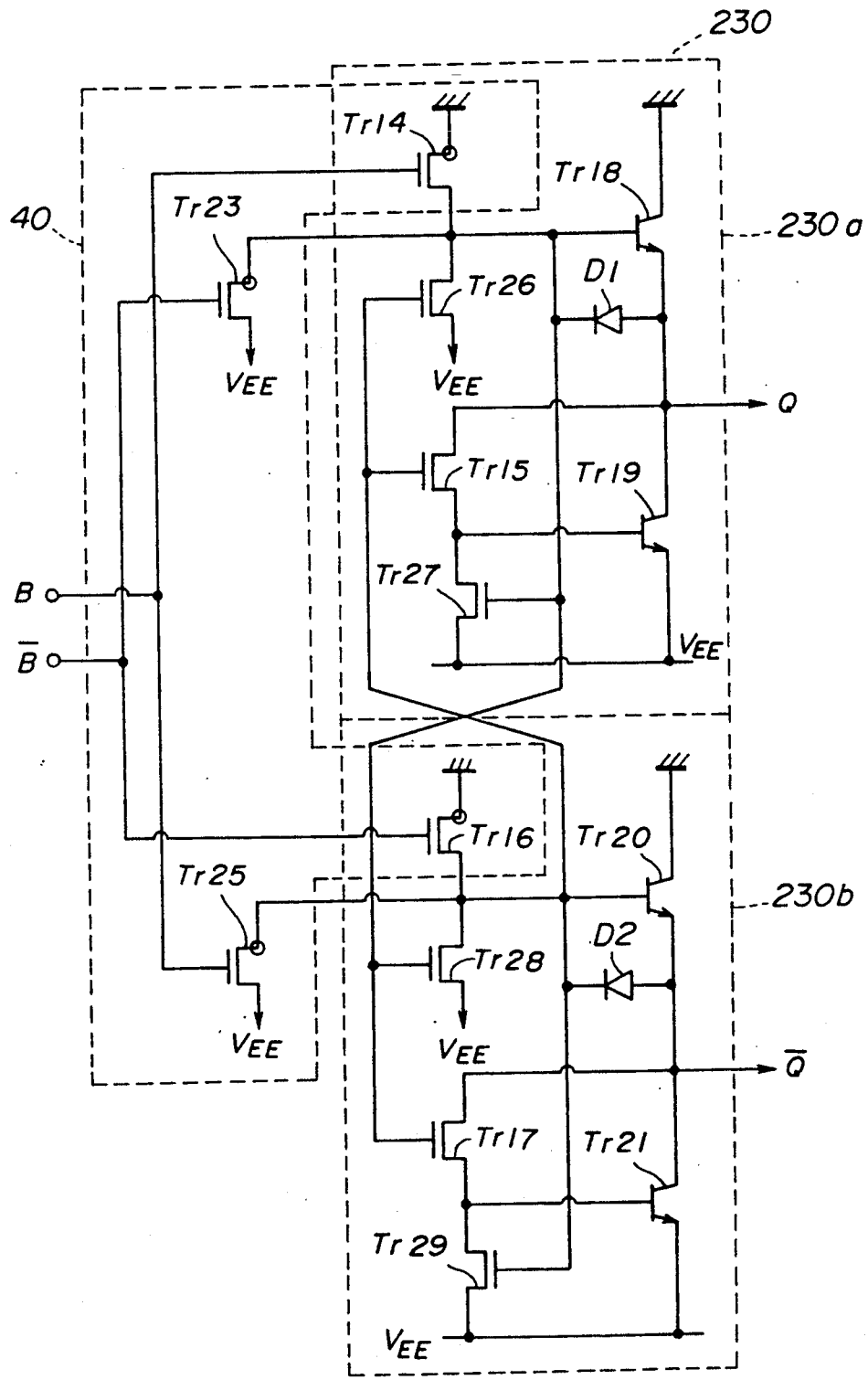
FIG. 8 is a circuit diagram of a level conversion circuit according to a third preferred embodiment of the present invention.

A description will now be given of a third preferred embodiment of the present invention with reference to FIG. 8. The level conversion circuit shown in FIG. 8 is composed of a level converter 40 and a buffer gate circuit 230 which is composed of buffer gates 230a and 230b. The P-channel MOS transistor Tr14 of the buffer gate 230a shown in FIG. 8 also functions as the P-channel MOS transistor Tr22 of the level converter 4 shown in FIG. 7. That is, the transistor Tr14 is provided in common for the level converter 40 and the buffer gate 230a. The P-channel MOS transistor Tr16 of the buffer gate 230b shown in FIG. 8 also functions as the P-channel MOS transistor Tr24 of the level converter 4 shown in FIG. 7. That is, the transistor Tr16 is provided in common for the level converter 40 and the buffer gate 230b. The gates of the transistors Tr15 and Tr26 of the buffer gate 230a are connected to the base of the transistor Tr20 of the buffer gate 230b. Similarly, the gates of the transistors Tr17 and Tr28 in the buffer gate 230b are connected to the base of the transistor Tr18. The gate of the transistor Tr27 is also connected to the base of the transistor Tr18, and the gate of the transistor Tr29 is connected to the base of the transistor Tr20. The level conversion circuit shown in FIG. 8 operates in the same way as the level conversion circuit shown in FIG. 7. The number of elements necessary to form the level conversion circuit shown in FIG. 8 is less than that necessary to form the level conversion circuit shown in FIG. 6 or FIG. 7. The transistors Tr27 and Tr29 rise more rapidly than those in the aforementioned first embodiment of the present invention (FIG. 6). Thus the output signals Q and $\overline{Q}$ rise more rapidly than those in the first embodiment of the present invention. Except the above, the level inversion circuit shown in FIG. 8 operate in the same way as that shown in FIG. 6.

Figure 9:
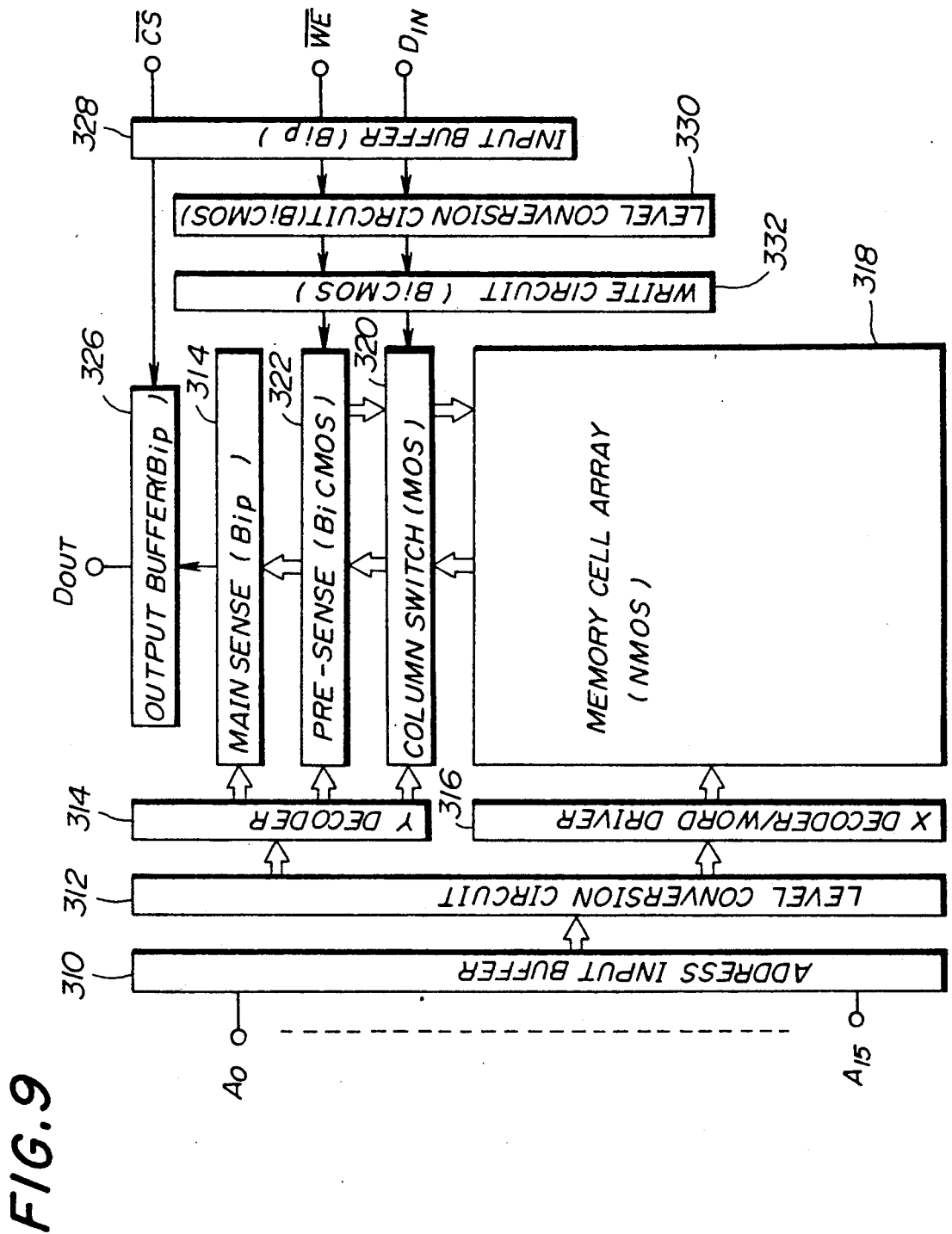
FIG. 9 is a block diagram of a BiCMOS-ECL SRAM to which the present invention is applied.

The prevent invention is suitably applied to a BiCMOS-ECL SRAM. FIG. 9 is a block diagram of a BiCMOS-ECL SRAM. The BiCMOS-ECL SRAM includes an address input buffer 310, a level conversion circuit 312, a Y-decoder 314, an X-decoder/word driver 316, a memory cell array 318, a column switch 320, a pre-sense circuit 322, a main sense circuit 324, an output buffer 526, an input buffer 328, a level conversion circuit 330 and a write circuit 332. An address signal consisting of address bits $A_0$–$A_{15}$ is input to the address input buffer 310. The address signal is an ECL-level signal, which is converted into a TTL-level signal by the level conversion circuit 312. The present invention is applied to the level conversion circuit 312. The TTL-level address signal is decoded by the Y-decoder 314 and the X-decoder/word driver 316 so that an row address and a column address are generated. A low-active chip select signal $\overline{CS}$, a low-active write enable signal $\overline{WE}$ and data Din are applied to the input buffer 328. The write enable signal $\overline{WE}$ and the data Din are ECL-level signals. The write enable signal $\overline{WE}$ and data Din are converted into TTL-level signals by the level conversion circuit 330. The level conversion circuit according to the present invention is applied to the level conversion circuit 330. The TTL-level data output from the level conversion circuit 330 is applied to the column switch 320 through the write circuit 332, and the TTL-level write enable signal $\overline{WE}$ is input to the pre-sense circuit 322. The chip select signal $\overline{CS}$ from the input buffer 328 is applied to the output buffer 326.

The present invention is applied to not only SRAMs but also other circuits such as gate arrays.

The present invention is not limited to the specifically described embodiments, and variations and modifications may be made without departing from the scope of the present invention.

What is claimed is:
1. A level conversion circuit comprising:
a level converter receiving first and second input signals which are complementary ECL-level signals, said level converter including first and second P-channel MOS transistors which are connected in series between a first power source and a second power source, and third and fourth P-channel

MOS transistors which are connected in series between said first power source and said second power source, said first input signal being applied to gates of said first and fourth P-channel MOS transistors, said second input signal being applied to gates of said second and third P-channel MOS transistors, a first output signal being drawn from a first connection node where said first and second P-channel MOS transistors are connected in series, a second output signal being drawn from a second connection node where said third and fourth P-channel MOS transistors are connected in series; and a buffer gate circuit having a first buffer gate and a second buffer gate, said first buffer gate including a fifth P-channel MOS transistor and a first impedance circuit connected in series between said first power source and a potential less than a potential of said first power source and including a first N-channel MOS transistor and a second impedance circuit connected in series between said first power source and said potential less than the potential of said first power source, said second input signal being applied directly to a gate of said fifth P-channel MOS transistor, said first output signal being applied to a gate of said first N-channel MOS transistor, said second buffer gate including a sixth P-channel MOS transistor and a third impedance circuit connected in series between said first power source and a potential less than a potential of said first power source and including a second N-channel MOS transistor and a fourth impedance circuit connected in series between said first power source and said potential less than the potential of said first power source, said first input signal being applied directly to a gate of said sixth P-channel MOS transistor, said second output signal being applied to a gate of said second N-channel MOS transistor, said buffer gate circuit including first driving means for receiving output signals from said fifth P-channel MOS transistor and said first N-channel MOS transistor and for generating a first TTL-level output signal, and second driving means for receiving output signals from said sixth P-channel MOS transistor and said second N-channel MOS transistor and for generating a second TTL-level output signal.

2. A level conversion circuit as claimed in claim 1, wherein:

each of said first, second, third and fourth impedance circuits comprises an N-channel MOS transistor;

said N-channel MOS transistor of said first impedance circuit having a gate supplied with said first output signal from said first connection node, a drain connected to a drain of said fifth P-channel MOS transistor and a source connected to said second power source;

said N-channel MOS transistor of said second impedance circuit having a gate connected to a drain of said first N-channel MOS transistor through which said first TTL-level output signal is drawn, a drain connected to a source of said first N-channel MOS transistor and a source connected to said second power source;

said N-channel MOS transistor of said third impedance circuit having a gate supplied with said second output signal from said second connection node, a drain connected to a drain of said sixth P-channel MOS transistor and a source connected to said second power source; and said N-channel MOS transistor of said fourth impedance circuit has a gate connected to a drain of said second N-channel MOS transistor through which said second TTL-level output signal is drawn, a drain connected to a source of said second N-channel MOS transistor and a source connected to said second power.

3. A level conversion circuit as claimed in claim 1, wherein:

said first output signal from said first connection node is supplied to the gate of the N-channel MOS transistor of said fourth impedance circuit; and said second output signal from said second connection node is applied to the gate of the N-channel MOS transistor of said second impedance circuit.

4. A level conversion circuit as claimed in claim 1, wherein:

said first P-channel MOS transistor has a source connected to said first power source and a drain connected to the gate of said first N-channel MOS transistor;

said second P-channel MOS transistor has a source connected to the drain of said first P-channel MOS transistor and a drain connected to said second power source;

said third P-channel MOS transistor has a source connected to said first power source and a drain connected to the gate of said second N-channel MOS transistor; and said fourth P-channel MOS transistor has a source connected to the drain of said third P-channel MOS transistor and a drain connected to said second power source.

5. A level conversion circuit as claimed in claim 2, wherein said first buffer gate comprises a first diode having an anode connected to the drain of said first N-channel MOS transistor and a cathode connected to a drain of said fifth P-channel MOS transistor, and said second buffer gate comprises a second diode having an anode connected to the drain of said second N-channel MOS transistor and a cathode connected to a drain of said sixth P-channel MOS transistor.

6. A level conversion circuit as claimed in claim 3, wherein said first buffer gate comprises a first diode having an anode connected to the drain of said first N-channel MOS transistor and a cathode connected to a drain of said fifth P-channel MOS transistor, and said second buffer gate comprises a second diode having an anode connected to the drain of said second N-channel MOS transistor and a cathode connected to a drain of said sixth P-channel MOS transistor.

7. A level conversion circuit as claimed in claim 1, wherein:

said first driving means comprises a first bipolar transistor having a collector connected to said first power source, a base connected to a drain of said fifth P-channel MOS transistor and said first impedance circuit and an emitter, and a second bipolar transistor having a collector connected to the emitter of said first bipolar transistor, a base connected to a source of said first N-channel MOS transistor and an emitter connected to said second power source;

said first TTL-level output signal is drawn from a connection node where the emitter of said first bipolar transistor is connected to the collector of said second bipolar transistor;

said second driving means comprises a third bipolar transistor having a collector connected to said first power source, a base connected to a drain of said sixth P-channel MOS transistor and said third impedance circuit and an emitter, and a fourth bipolar transistor having a collector connected to the emitter of said third bipolar transistor, a base connected to a source of said second N-channel MOS transistor and an emitter connected to said second power source; and said second TTL-level output signal is drawn from a connection node where the emitter of said third bipolar transistor is connected to the collector of said fourth bipolar transistor.

8. A level conversion circuit comprising:

a level converter receiving first and second input signals which are complementary ECL-level signals, said level converter including first and second P-channel MOS transistors which are connected in series between a first power source and a second power source, and third and fourth P-channel MOS transistors which are connected in series between said first power source and said second power source, said first input signal being applied to gates of said first and fourth P-channel MOS transistors, said second input signal being applied to gates of said second and third P-channel MOS transistors, a first output signal being drawn from a first connection node where said first and second P-channel MOS transistors are connected in series, a second output signal being drawn from a second connection node where said third and fourth P-channel MOS transistors are connected in series; and a buffer gate circuit having a first buffer gate and a second buffer gate, said first buffer gate including said first P-channel MOS transistor and a first N-channel MOS transistor connected in series between said first and second power sources, said first buffer gate including a second N-channel MOS transistor and a third N-channel MOS transistor connected in series between said first and second power sources, said second buffer gate including said third P-channel MOS transistor and a fourth N-channel MOS transistor connected in series between said first and second power sources, said second buffer gate including a fifth N-channel MOS transistor and a sixth N-channel MOS transistor connected in series between said first and second power sources, said first output signal from said first connection node being applied to gates of said third, fourth and fifth N-channel MOS transistors, said second output signal from said second connection node being applied to gates of said first, third and sixth N-channel MOS transistors, said buffer gate circuit including first driving means for receiving two output signals respectively supplied from said first connection node and a connection node where said second and third N-channel MOS transistors are connected in series and for generating a first TTL-level output signal, and second driving means for receiving two output signals respectively supplied from said second connection node and a connection node where said fifth and sixth N-channel MOS transistors are connected in series and for generating a second TTL-level output signal.

9. A level conversion circuit as claimed in claim 8, wherein:

said first driving means comprises a first bipolar transistor having a collector connected to said first power source, a base connected to said first connection node and an emitter, and a second bipolar transistor having a collector connected to the emitter of said first bipolar transistor, a base connected to a source of said second N-channel MOS transistor and an emitter connected to said second power source;

said first TTL-level output signal is drawn from a connection node where the emitter of said first bipolar transistor is connected to the collector of said second bipolar transistor;

said second driving means comprises a third bipolar transistor having a collector connected to said first power source, a base connected to said second connection node and an emitter, and a fourth bipolar transistor having a collector connected to the emitter of said third bipolar transistor, a base connected to a source of said fifth N-channel MOS transistor and an emitter connected to said second power source; and said second TTL-level output signal is drawn from a connection node where the emitter of said third bipolar transistor is connected to the collector of said fourth bipolar transistor.

10. A level conversion circuit as claimed in claim 9, wherein:

said first buffer gate comprises a first diode having an anode connected to the emitter of said first bipolar transistor and a cathode connected to the base of said first bipolar transistor; and said second buffer gate comprises a second diode having an anode connected to the emitter of said third bipolar transistor and a cathode connected to the base of said third bipolar transistor.

11. A level conversion circuit comprising:

a level converter receiving first and second input signals which are complementary ECL-level signals, said level converter including first and second P-channel MOS transistors which are connected in series between a first power source and a second power source, said first input signal being applied to a gate of said first P-channel MOS transistor, said second input signal being applied to a gate of said second P-channel MOS transistor, an output signal being drawn from a connection node where said first and second P-MOS transistors are connected in series; and a buffer gate circuit having a buffer gate, said buffer gate including a third P-channel MOS transistor and a first impedance which are connected in series between said first power source and a predetermined potential less than a potential of said first power source, said first buffer gate including an N-channel MOS transistor and a second impedance circuit which are connected in series between said first power source and a potential less than the potential of said first power source, said third P-channel MOS transistor having a gate to which said second input signal is directly applied, and said N-channel MOS transistor having a gate to which said output signal from said connection node is applied, said buffer gate circuit including driving means for receiving output signals from said third P-channel MOS transistor and said N-channel MOS transistor and for generating a TTL-level output signal.

12. A level conversion circuit as claimed in claim 11, wherein:

each of said first and second impedance circuits comprises an N-channel MOS transistor;

the N-channel MOS transistor of said first impedance circuit having a gate to which said output signal from said node is applied, a drain connected to a drain of said third P-channel MOS transistor and a source connected to said second power source; and the N-channel MOS transistor of said second impedance circuit having a gate coupled to the drain of said third P-channel MOS transistor, a drain connected to a source of said N-channel MOS transistor having the gate connected to said connection node and a source connected to said second power source.

13. A level conversion circuit as claimed in claim 12, wherein said buffer gate includes a diode having an anode connected to the gate of said N-channel MOS transistor of said second impedance circuit and a cathode connected to the drain of said third P-channel MOS transistor.

14. A level conversion circuit comprising:

a level converter receiving first and second input signals which are complementary ECL-level signals, said level converter including first and second P-channel MOS transistors which are coupled in series between a first power source and a second power source, said first input signal being applied to a gate of said first P-channel MOS transistor, said second input signal being applied to a gate of said second P-channel MOS transistor, and an output signal of said level converter being drawn from a connection node where said first and second P-channel MOS transistors are connected in series; and a buffer gate circuit including a third P-channel MOS transistor having a drain, a source coupled to said first power source, and agate operatively connected to directly receive said second input signal, an N-channel MOS transistor having a drain, a source, and a gate operatively connected to receive said output signal of said level converter, said buffer gate circuit including driving means for receiving a first signal output from the drain of said third P-channel MOS transistor and a second signal output from the source of said N-channel MOS transistor and for outputting a TTL-level output signal to an output terminal of said buffer gate circuit coupled to the drain of said N-channel MOS transistor.

15. A level conversion circuit as claimed in claim 14, wherein said driving means comprises:

a first bipolar transistor having a collector coupled to said first power source, an emitter coupled to said output terminal of said buffer gate circuit, and a base coupled to the drain of said first P-channel MOS transistor; and a second bipolar transistor having a collector coupled to said output terminal of said buffer gate circuit, an emitter coupled to said second power source, and a base coupled to the source of said N-channel MOS transistor.

16. A level conversion circuit as claimed in claim 15, further comprising:

first discharging means for discharging the base of said first bipolar transistor; and second discharging means for discharging the base of said second bipolar transistor.

17. A level conversion circuit comprising:

a level converter receiving first and second input signals which are complementary ECL-level signals, said level converter including first and second P-channel MOS transistors which are coupled in series between a first power source and a second power source, said first input signal being applied to a gate of said first P-channel MOS transistor, said second input signal being applied to a gate of said second P-channel MOS transistor, a first output signal of said level converter being drawing from a first connection node where said first and second P-channel MOS transistor are connected in series, said level converter further comprising third and fourth P-channel MOS transistors which are coupled in series between said first power source and said second power source, said first input signal being applied to a gate of said fourth P-channel MOS transistor, said second input signal being applied to a gate of said third P-channel MOS transistor, and a second output signal of said level converter being drawing from a second connection node where said third and fourth P-channel MOS transistors are connected in series; and a buffer gate circuit including said first P-channel MOS transistor, and an N-channel MOS transistor having a drain, a source, and a gate operatively connected to receive said second output signal of said level converter, said buffer gate circuit including driving means for receiving said first output signal of said level converter and a signal output from the source of said N-channel MOS transistor and for outputting a TTL-level output signal to an output terminal of said buffer gate circuit coupled to the drain of said N-channel MOS transistor.

18. A level conversion circuit as claimed in claim 17, wherein said driving means comprises:

a first bipolar transistor having a collector coupled to said first power source, an emitter coupled to said output terminal of said buffer gate circuit, and a base coupled to the drain of said first P-channel MOS transistor; and a second bipolar transistor having a collector coupled to said output terminal of said buffer gate circuit, an emitter coupled to said second power source, and a base coupled to the source of said N-channel MOS transistor.

19. A level conversion circuit as claimed in claim 18, further comprising:

first discharging means for discharging the base of said first bipolar transistor; and second discharging means for discharging the base of said second bipolar transistor.

* * * * *

UNITED STATES PATENT AND TRADEMARK OFFICE
CERTIFICATE OF CORRECTION

PATENT NO. : 5,138,199

DATED : August 11, 1992

INVENTOR(S) : Hirata et al.

It is certified that error appears in the above-identified patent and that said Letters Patent is hereby corrected as shown below:

Col. 1, line 29, "volta" should be --voltage--.

Col. 5, line 45, "T23" should be --Tr23--.

Col. 6, line 16, "give" should be --given--.

Col. 8, line 21, "Q and Q" should be --Q and $\overline{Q}$--.
line 25, "prevent" should be --present--;
line 32, "526," should be --326,--;
line 40, "an row" should be --a row--.

Col. 12, line 61, delete "first".

Col. 13, line 46, "agate" should be --a gate--.

Col. 14, line 22, "drawing" should be --drawn--;
line 33, "drawing" should be --drawn--.

Signed and Sealed this

Fourteenth Day of December, 1993

Attest:

BRUCE LEHMAN

Attesting Officer   Commissioner of Patents and Trademarks

UNITED STATES PATENT AND TRADEMARK OFFICE
CERTIFICATE OF CORRECTION

PATENT NO. : 5,138, 199
DATED : August 11, 1992
INVENTOR(S) : Hirata et al

It is certified that error appears in the above-indentified patent and that said Letters Patent is hereby corrected as shown below:

On the title page, Item [73] Assignee, after "Japan" insert -- and Fujitsu VLSI Limited, Kasugai, Japan--

Signed and Sealed this

First Day of March, 1994

Attest::

BRUCE LEHMAN

*Attesting Officer*     *Commissioner of Patents and Trademarks*